(12) United States Patent
Bi et al.

(10) Patent No.: US 11,043,493 B2
(45) Date of Patent: Jun. 22, 2021

(54) STACKED NANOSHEET COMPLEMENTARY METAL OXIDE SEMICONDUCTOR FIELD EFFECT TRANSISTOR DEVICES

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/158,995

(22) Filed: Oct. 12, 2018

(65) Prior Publication Data

US 2020/0119015 A1  Apr. 16, 2020

(51) Int. Cl.
*H01L 27/092* (2006.01)
*H01L 29/06* (2006.01)
(Continued)

(52) U.S. Cl.
CPC .... *H01L 27/0924* (2013.01); *H01L 21/02532* (2013.01); *H01L 21/02603* (2013.01); *H01L 21/823821* (2013.01); *H01L 29/0676* (2013.01); *H01L 29/161* (2013.01); *H01L 29/4966* (2013.01); *H01L 29/518* (2013.01);
(Continued)

(58) Field of Classification Search
CPC ........... H01L 27/0924; H01L 21/02532; H01L 21/823821; H01L 21/02603; H01L 29/518; H01L 29/66545; H01L 29/6681; H01L 29/0676; H01L 29/161; H01L 29/16; H01L 29/1304; H01L 29/7851; H01L 29/4966; H01L 29/0673; H01L 29/0653
See application file for complete search history.

(56) References Cited

U.S. PATENT DOCUMENTS 7,893,492 B2   2/2011  Bedell et al.
8,084,308 B2  12/2011  Chang et al.
(Continued)

OTHER PUBLICATIONS

Gibbons et al., "One-Gate-Wide CMOS Inverter on Laser-Recrystallized Polysilicon", IEEE Electron Device Letters, vol. 1, Issue 6. Jun. 1980. pp. 117-118.

*Primary Examiner* — Galina G Yushina
(74) *Attorney, Agent, or Firm* — Tutunjian & Bitetto, P.C.; Erik Johnson

(57) ABSTRACT

A method of forming a stacked nanosheet complementary metal-oxide-semiconductor (CMOS) field effect transistor (FET) device is provided. The method includes forming a plurality of semiconductor layers on a substrate, and patterning the plurality of semiconductor layers to form a plurality of multi-layer nanosheet fins with a fill layer between the multi-layer nanosheet fins and an endwall support on opposite ends of the nanosheet fins. The method further includes reducing the height of the fill layer to expose at least a top three semiconductor nanosheet segments of the multi-layer nanosheet fins, and removing two of the at least top three semiconductor nanosheet segments. The method further includes forming a protective layer on one of the at least top three semiconductor nanosheet segments.

16 Claims, 12 Drawing Sheets

(51) Int. Cl.
  *H01L 21/8238* (2006.01)
  *H01L 29/78* (2006.01)
  *H01L 29/49* (2006.01)
  *H01L 29/51* (2006.01)
  *H01L 29/66* (2006.01)
  *H01L 21/02* (2006.01)
  *H01L 29/161* (2006.01)

(52) U.S. Cl.
  CPC .... *H01L 29/6681* (2013.01); *H01L 29/66545* (2013.01); *H01L 29/7851* (2013.01)

(56) References Cited

U.S. PATENT DOCUMENTS

| | | | |
|---|---|---|---|
| 9,224,811 B2 | 12/2015 | Cheng et al. | |
| 9,583,491 B2 | 2/2017 | Kim et al. | |
| 9,660,028 B1 | 5/2017 | Cheng et al. | |
| 9,735,269 B1 | 8/2017 | Cheng et al. | |
| 9,805,982 B1 | 10/2017 | Zang et al. | |
| 9,837,414 B1* | 12/2017 | Balakrishnan | H01L 29/1083 |
| 9,997,519 B1 | 6/2018 | Bao et al. | |
| 10,032,867 B1* | 7/2018 | Yeung | H01L 29/0649 |
| 2014/0091279 A1* | 4/2014 | Kachian | B82Y 10/00 257/27 |
| 2015/0325481 A1* | 11/2015 | Radosavljevic | H01L 29/66469 438/154 |
| 2017/0221708 A1 | 8/2017 | Bergendahl et al. | |
| 2017/0323952 A1* | 11/2017 | Cheng | H01L 29/7842 |
| 2017/0345915 A1* | 11/2017 | Coquand | H01L 21/02532 |
| 2018/0076095 A1* | 3/2018 | Cheng | H01L 29/4908 |
| 2018/0114727 A1* | 4/2018 | Rodder | H01L 29/42364 |
| 2018/0277630 A1* | 9/2018 | Bi | H01L 29/0684 |
| 2018/0301341 A1* | 10/2018 | Coquand | H01L 29/401 |
| 2020/0020692 A1* | 1/2020 | Ching | H01L 29/785 |
| 2020/0044045 A1* | 2/2020 | Wang | H01L 29/1054 |
| 2020/0058653 A1* | 2/2020 | Chiang | H01L 21/823821 |

\* cited by examiner

US 11,043,493 B2

STACKED NANOSHEET COMPLEMENTARY METAL OXIDE SEMICONDUCTOR FIELD EFFECT TRANSISTOR DEVICES

BACKGROUND

Technical Field

The present invention generally relates to nanosheet complementary metal-oxide-semiconductor (CMOS) field effect transistor (FET) devices, and more particularly to strained nanosheet complementary metal-oxide-semiconductor field effect transistor devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a stacked nanosheet complementary metal-oxide-semiconductor (CMOS) field effect transistor (FET) device is provided. The method includes forming a plurality of semiconductor layers on a substrate, and patterning the plurality of semiconductor layers to form a plurality of multi-layer nanosheet fins with a fill layer between the multi-layer nanosheet fins and an endwall support on opposite ends of the nanosheet fins. The method further includes reducing the height of the fill layer to expose at least a top three semiconductor nanosheet segments of the multi-layer nanosheet fins, and removing two of the at least top three semiconductor nanosheet segments. The method further includes forming a protective layer on one of the at least top three semiconductor nanosheet segments.

In accordance with another embodiment of the present invention, a method of forming a stacked nanosheet CMOS FET device is provided. The method includes forming seven semiconductor layers on a substrate, and patterning the seven semiconductor layers to form a multi-layer nanosheet fin with an endwall support on opposite ends of the nanosheet fin. The method further includes removing a fifth and a seventh semiconductor nanosheet segment, and forming a protective layer on a sixth semiconductor nanosheet segment and a protective cap on a portion of a fourth semiconductor nanosheet segment.

In accordance with yet another embodiment of the present invention, a stacked nanosheet complementary metal-oxide-semiconductor (CMOS) field effect transistor (FET) device is provided. The CMOS FET device includes a lower semiconductor channel sheet on a substrate, and an upper semiconductor channel sheet on the substrate above the lower semiconductor channel sheet, wherein the upper semiconductor channel sheet is a different semiconductor material than the lower semiconductor channel sheet. The CMOS FET device further includes a partition sheet on the substrate between the upper semiconductor channel sheet and the lower semiconductor channel sheet.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide stacked nanosheet complementary metal-oxide-semiconductor (CMOS) field effect transistor (FET) devices, where a p-type FET (pFET) and an n-type FET (nFET) are in the same nanosheet stack. A compressively strained semiconductor nanosheet channel segment can be used for the pFET to boost hole mobility and pFET performance without an external stressor feature. The intrinsic compressive strain of the semiconductor channel segment can provide sufficient strain.

Embodiments of the present invention provide a stacked nanosheet complementary metal-oxide-semiconductor (CMOS) field effect transistor (FET) device with a shared active gate structure on the pFET and nFET in the same nanosheet stack.

Embodiments of the present invention provide a stacked nanosheet complementary metal-oxide-semiconductor (CMOS) field effect transistor (FET) device with a dielectric isolation layer sandwiched between vertically stacked nanosheet CMOS FET devices.

Embodiments of the present invention provide a method of fabricating a stacked nanosheet complementary metal-oxide-semiconductor (CMOS) field effect transistor (FET) device with a shared active gate structure.

Exemplary applications/uses to which the present invention can be applied include, but are not limited to: digital logic devices utilizing CMOS devices and circuitry, including, but not limited to digital logic devices, for example, NAND gates, NOR gates, XOR gates, etc., and mobile and/or communication circuitry.

It is to be understood that aspects of the present invention will be described in terms of a given illustrative architecture; however, other architectures, structures, substrate materials and process features and steps can be varied within the scope of aspects of the present invention.

Figure 1:
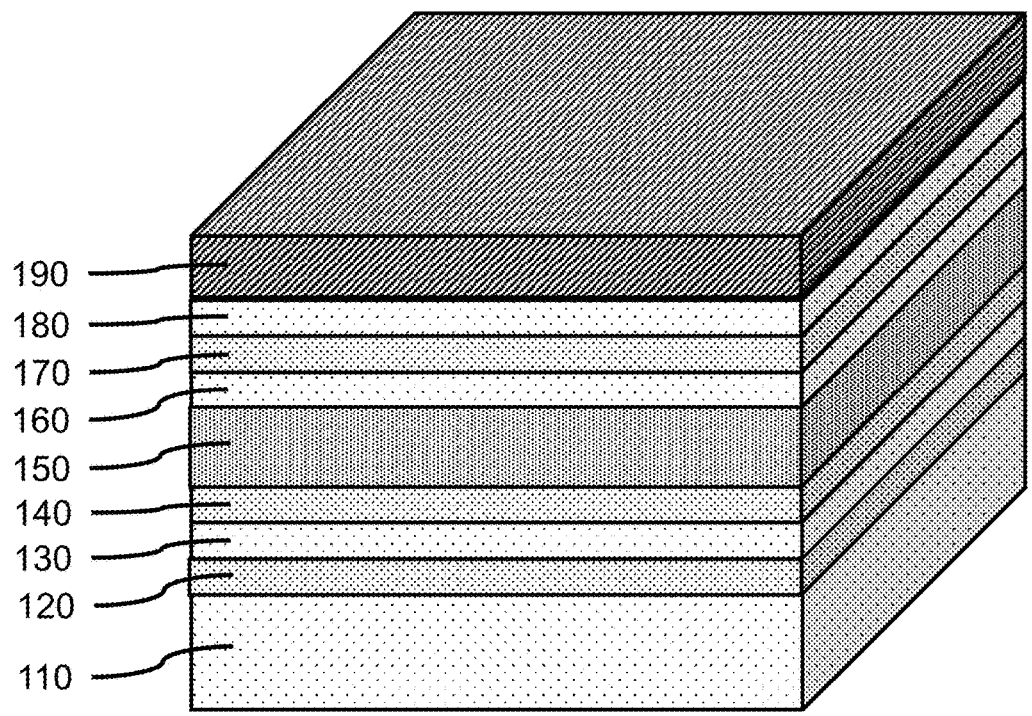
FIG. 1 is an isometric view showing a hardmask layer on a plurality of semiconductor layers on a substrate, in accordance with an embodiment of the present invention.

Referring now to the drawings in which like numerals represent the same or similar elements and initially to FIG. 1, an isometric view of a hardmask layer on a plurality of semiconductor layers on a substrate is shown, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)). In various embodiments, the substrate 110 can be a single crystal silicon (Si) or silicon-germanium (SiGe) wafer.

In one or more embodiments, a stack of nanosheet layers can be formed on the substrate 110, where the nanosheet stack can include seven layers. The stack of nanosheet layers can include a combination of alternating silicon (Si) and silicon-germanium (SiGe) layers, where the concentration of germanium can be different in the different SiGe layers.

In one or more embodiments, a first semiconductor nanosheet layer 120 can be formed on a substrate 110, where the first semiconductor nano sheet layer 120 can be formed by an epitaxial or heteroepitaxial growth process, for example, molecular beam epitaxy (MBE), liquid phase epitaxy (LPE), or gas phase epitaxy (GPE). The first semiconductor nanosheet layer 120 can be doped to be an n-type semiconductor nanosheet layer or a p-type semiconductor nanosheet layer, or an undoped intrinsic semiconductor nanosheet layer.

In various embodiments, the first semiconductor nanosheet layer 120 can be an intrinsic silicon-germanium (SiGe) layer, where the germanium concentration can be in a range of about 15 atomic percent (at. %) to about 50 at. %, or about 20 at. % to about 30 at. %, or about 25 at. %. The first semiconductor nanosheet layer 120 can be a different semiconductor material than the substrate.

In one or more embodiments, a second semiconductor nanosheet layer 130 can be formed on the first semiconductor nanosheet layer 120, where the second semiconductor nanosheet layer 130 can be formed by an epitaxial or heteroepitaxial growth process.

In one or more embodiments, the second semiconductor nanosheet layer 130 can be doped to be an n-type second semiconductor nanosheet layer 130 or a p-type second semiconductor nanosheet layer 130, or the second semiconductor nanosheet layer 130 can be an intrinsic semiconductor layer. In various embodiments, n-type dopants can be, for example, phosphorus (P) or arsenic (As), and p-type dopants can be, for example, boron (B) or gallium (Ga). In various embodiments, the second semiconductor nanosheet layer 130 can be a semiconductor material, including, but not limited to n-type (e.g., P or As) doped silicon (Si) or p-type (e.g., B) doped silicon-germanium (SiGe). The second semiconductor nanosheet layer 130 can be the same semiconductor material as or a different semiconductor material than the substrate 110. The second semiconductor nanosheet layer 130 can be a different semiconductor material than the first semiconductor nanosheet layer 120, so the first semiconductor nanosheet layer 120 can be selectively removed.

In one or more embodiments, a third semiconductor nanosheet layer 140 can be formed on the second semiconductor nanosheet layer 130, where the third semiconductor nanosheet layer 140 can be formed by an epitaxial or heteroepitaxial growth process. The third semiconductor nanosheet layer 140 can be doped to be an n-type semiconductor nanosheet layer or a p-type semiconductor nanosheet layer, or an intrinsic semiconductor nanosheet layer.

In various embodiments, the third semiconductor nanosheet layer 140 can be an intrinsic silicon-germanium (SiGe) layer, where the germanium concentration can be in a range of about 15 atomic percent (at. %) to about 50 at. %, or about 20 at. % to about 30 at. %, or about 25 at. %.

In one or more embodiments, a fourth semiconductor nanosheet layer 150 can be formed on the third semiconductor nanosheet layer 140, where the fourth semiconductor nanosheet layer 150 can be formed by an epitaxial or heteroepitaxial growth process. The fourth semiconductor nanosheet layer 150 can be doped to be an n-type semiconductor nanosheet layer or a p-type semiconductor nanosheet layer, or an intrinsic semiconductor nanosheet layer.

In various embodiments, the fourth semiconductor nanosheet layer 150 can be a silicon-germanium (SiGe) layer, where the germanium concentration can be in a range of about 40 atomic percent (at. %) to about 70 at. %, or about 50 at. % to about 60 at. %, where the germanium concentration of the fourth semiconductor nanosheet layer 150 can be greater than the germanium concentration of the third and first semiconductor nanosheet layers, so the fourth semiconductor nanosheet layer 150 can be selectively removed.

In one or more embodiments, a fifth semiconductor nanosheet layer 160 can be formed on the fourth semiconductor nanosheet layer 150, where the fifth semiconductor nanosheet layer 160 can be formed by an epitaxial or heteroepitaxial growth process. The fifth semiconductor nanosheet layer 160 can be doped to be an n-type semiconductor nanosheet layer or a p-type semiconductor nanosheet layer, or an intrinsic semiconductor nanosheet layer. In various embodiments, the fifth semiconductor nanosheet layer 160 can be intrinsic silicon (Si).

In one or more embodiments, a sixth semiconductor nanosheet layer 170 can be formed on the fifth semiconductor nanosheet layer 160, where the sixth semiconductor nanosheet layer 170 can be formed by an epitaxial or heteroepitaxial growth process. In various embodiments, the sixth semiconductor nanosheet layer 170 can be a silicon-germanium (SiGe) layer, where the germanium concentration can be in a range of about 15 at. % to about 50 at. %, or about 20 at. % to about 30 at. %, or about 25 at. %.

In one or more embodiments, the sixth semiconductor nanosheet layer 170 can be doped to be an n-type semiconductor nanosheet layer or a p-type semiconductor nanosheet layer, or an intrinsic semiconductor nanosheet layer. In various embodiments, the sixth semiconductor nanosheet layer 170 can be a semiconductor material, including, but not limited to n-type (e.g., P or As) doped silicon (Si) or p-type (e.g., B) doped silicon-germanium (SiGe). The sixth semiconductor nanosheet layer 170 can be a different semiconductor material than the fifth semiconductor nanosheet layer 160, so the fifth semiconductor nanosheet layer 160 can be selectively removed. In various embodiments, the sixth semiconductor nanosheet layer 170 can be a different semiconductor material and have a different dopant type from the second semiconductor nanosheet layer 130, so the sixth semiconductor nanosheet layer 170 can form a different type FET than the second semiconductor nanosheet layer 130.

In one or more embodiments, a seventh semiconductor nanosheet layer 180 can be formed on the sixth semiconductor nanosheet layer 170, where the seventh semiconductor nanosheet layer 180 can be formed by an epitaxial or heteroepitaxial growth process. The seventh semiconductor nanosheet layer 180 can be doped to be an n-type semiconductor nanosheet layer or a p-type semiconductor nanosheet layer, or an intrinsic semiconductor nanosheet layer. In various embodiments, the seventh semiconductor nanosheet layer 180 can be an intrinsic silicon (Si).

In various embodiments, the semiconductor nanosheet layers 120, 130, 140, 160, 170, 180 can have a thickness in a range of about 5 nm to about 40 nm, or about 10 nm to about 20 nm, although other thicknesses are also contemplated. The fourth semiconductor nanosheet layer 150 can have a thickness in a range of about 5 nm to about 60 nm, or about 20 nm to about 50 nm, although other thicknesses are also contemplated.

In various embodiments, a fin template layer 190 can be formed on the seventh semiconductor nanosheet layer 180, where the fin template layer 190 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The fin template layer 190 can be formed by a blanket deposition, for example, chemical vapor deposition (CVD) plasma enhanced CVD (PECVD), physical vapor deposition (PVD) or a spin-on process.

Figure 2:
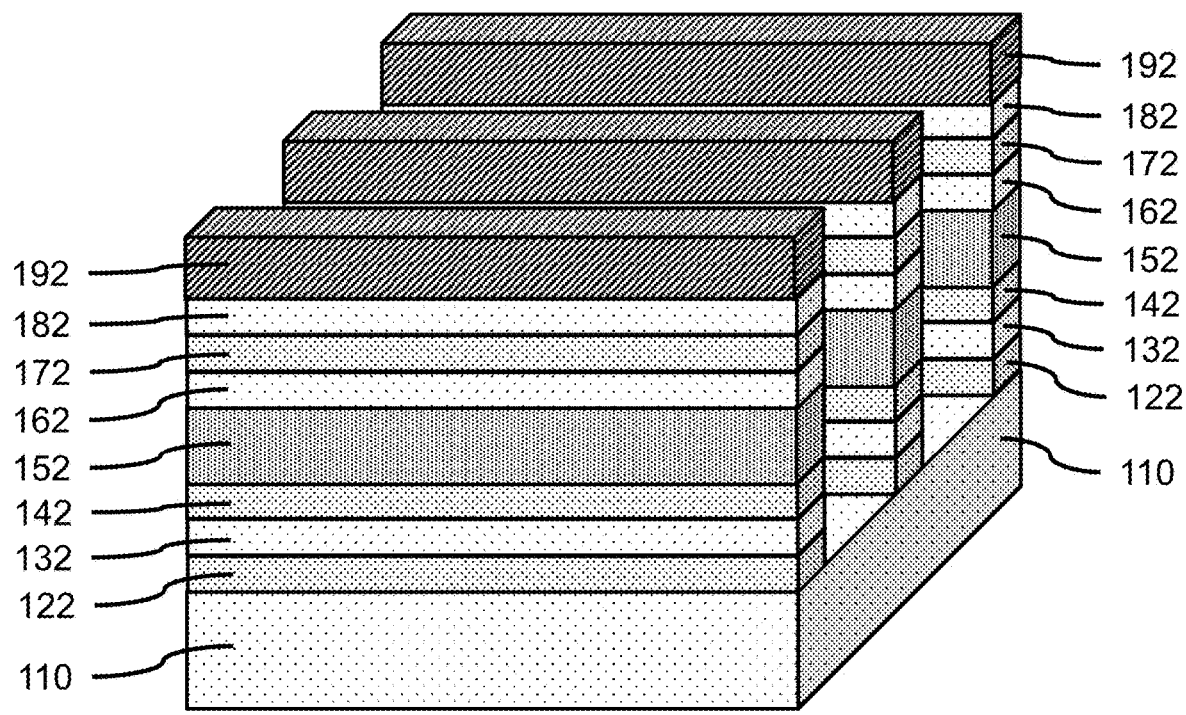
FIG. 2 is an isometric view showing the plurality of semiconductor layers patterned to form a plurality of multi-layer nanosheet fin structures using fin templates, in accordance with an embodiment of the present invention.

FIG. 2 is an isometric view showing the plurality of semiconductor layers patterned to form a plurality of multi-layer nanosheet fin structures using fin templates, in accordance with an embodiment of the present invention.

In one or more embodiments, the fin template layer 190 can be patterned using lithographic and etching process to form one or more fin templates 192. The plurality of semiconductor nanosheet layers 120, 130, 140, 150, 160, 170, 180 can be patterned to form a plurality of multi-layer nanosheet fin structures using the fin templates 192. Portions of the plurality of semiconductor nanosheet layers exposed between the fin templates 192 can be removed using a directional etch, for example, a reactive ion etch (RIE) to form one or more multi-layer nanosheet fin structures. The multi-layer nanosheet fin structures can include a seventh semiconductor nanosheet section 182 below the fin template 192, a sixth semiconductor nanosheet section 172 below the seventh semiconductor nanosheet section 182, a fifth semiconductor nanosheet section 162 below the sixth semiconductor nanosheet section 172, a fourth semiconductor nanosheet section 152 below the fifth semiconductor nanosheet section 162, a third semiconductor nanosheet section 142 below the fourth semiconductor nanosheet section 152, a second semiconductor nanosheet section 132 below the third semiconductor nanosheet section 142, and a first semiconductor nanosheet section 122 below the second semiconductor nanosheet section 132 and on the substrate 110.

In one or more embodiments, one or more multi-layer nanosheet fin structures can be formed on the substrate 110. The multi-layer nanosheet fin structures can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The multi-layer nanosheet fin structures may be formed by a direct write process or double patterning process using, for example, immersion lithography, extreme ultraviolet lithography, or x-ray lithography. The fin templates 192 can be formed from the fin template layer 190, as part of the patterning process.

In one or more embodiments, each of the one or more multi-layer nanosheet fin structures can have a width in a range of about 5 nm to about 40 nm, or about 10 nm to about 30 nm, although other widths are also contemplated. In various embodiments, the nanosheet fin structures can be separate by a gap with a distance between facing sidewalls of about 5 nm to about 30 nm.

Although the nanosheet fin structures and semiconductor nanosheet sections are depicted in the figures perpendicular to the substrate 110 (i.e., having a 90 degree angle), the nanosheet fin structures can have a tapered sidewall that does not meet the substrate at a right angle (i.e., not exactly 90 degree). The top surface of the nanosheet fin structures may not be perfectly flat or rectangular, but may have a convex curved surface. The substrate surface can have a curved (concave) profile between the nanosheet fin structures.

Figure 3:
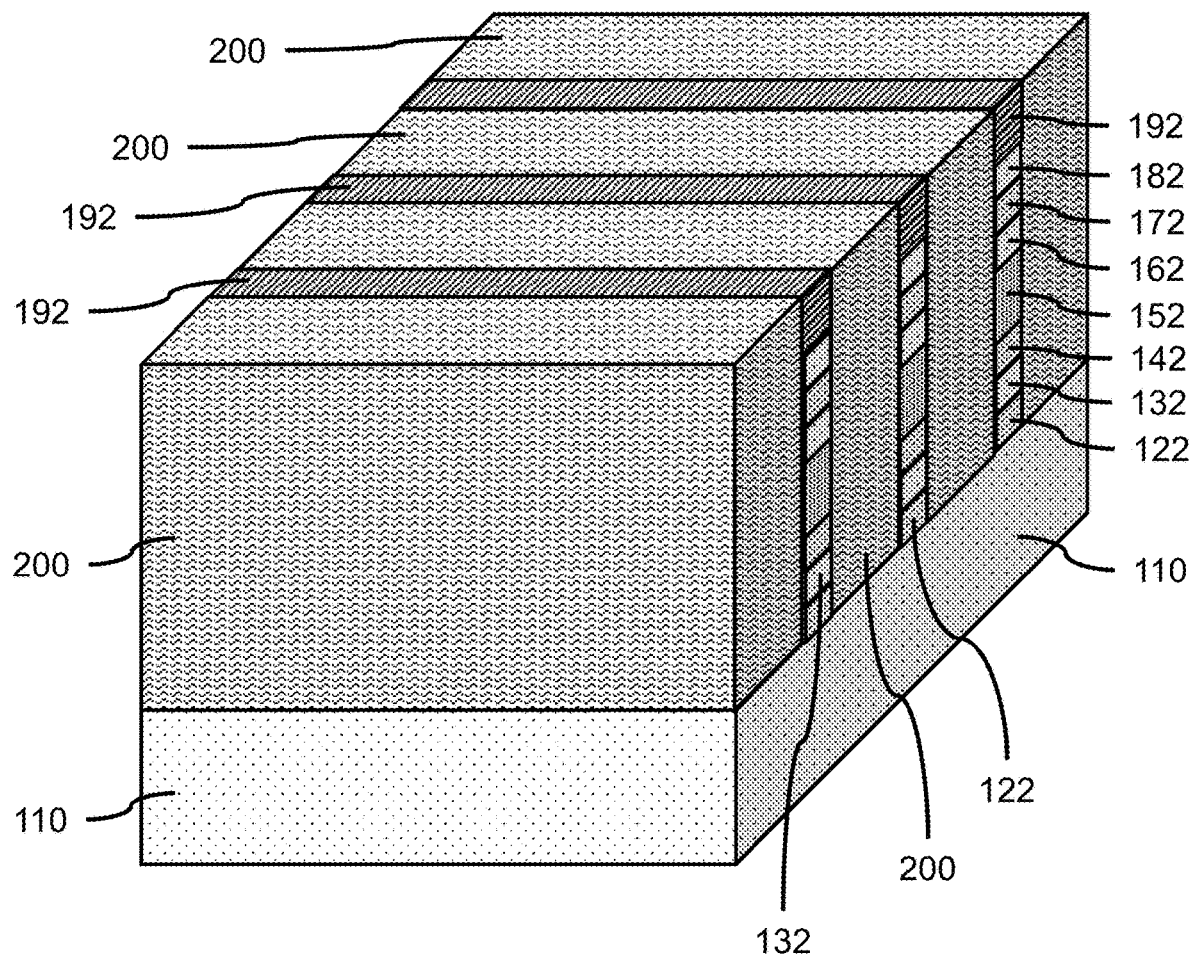
FIG. 3 is an isometric view showing a fill layer between the multi-layer nanosheet fin structures and fin templates, in accordance with an embodiment of the present invention.

FIG. 3 is an isometric view showing a fill layer between the multi-layer nanosheet fin structures and fin templates, in accordance with an embodiment of the present invention.

In one or more embodiments, a fill layer 200 can be formed between the multi-layer nanosheet fin structures and fin templates 192, where the fill layer 200 can be formed by a blanket deposition (e.g., CVD, PECVD, spin-on). Portions of the fill layer 200 that extend above the top surfaces of the fin template(s) 192 can be removed, for example, by chemical-mechanical polishing.

In various embodiments, the fill layer 200 can be a dielectric material, including, but not limited to, silicon oxide (SiO), a low-K dielectric material, or a combination thereof. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof.

Figure 4:
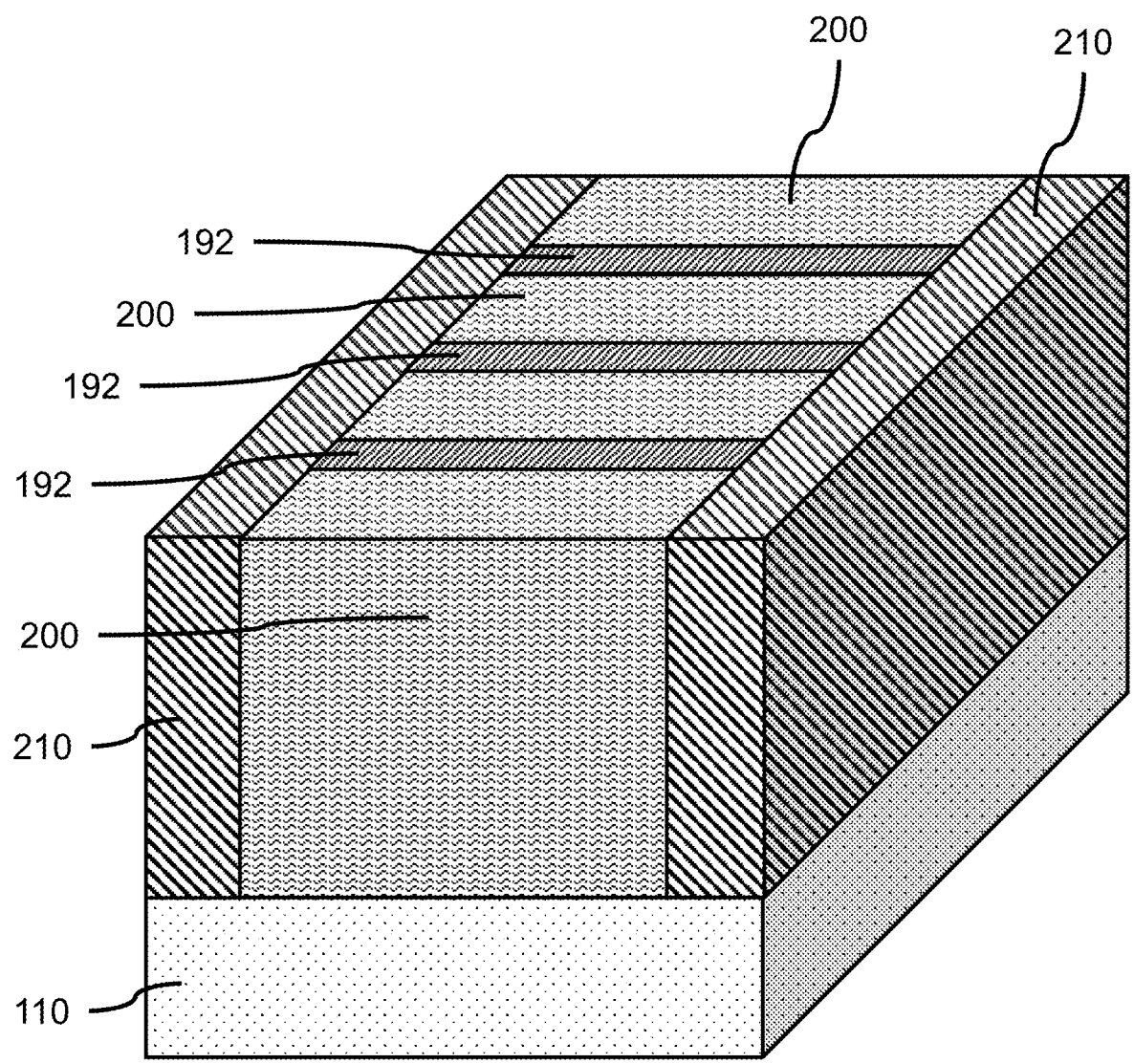
FIG. 4 is an isometric view showing the multi-layer nanosheet fin structures trimmed to form a plurality of multi-layer nanosheet fins with an endwall support on opposite ends of the nanosheet fins, in accordance with an embodiment of the present invention.

FIG. 4 is an isometric view showing the multi-layer nanosheet fin structures trimmed to form a plurality of multi-layer nanosheet fins with an endwall support on opposite ends of the nanosheet fins, in accordance with an embodiment of the present invention.

In one or more embodiments, the fin template(s) 192 and multi-layer nanosheet fin structure(s) can be trimmed to form a plurality of multi-layer nanosheet fin(s), where the nanosheet fin structures can be trimmed using lithographic and etching processes. The fin template(s) 192 and multi-layer nanosheet fin structure(s) can be masked, and portions of the multi-layer nanosheet fin structure(s) can be removed down to the surface of the substrate 110, for example, using a directional etch. A multi-layer nanosheet fin can include a segment of the first semiconductor nanosheet section 122, second semiconductor nanosheet section 132, third semiconductor nanosheet section 142, fourth semiconductor nanosheet section 152, fifth semiconductor nanosheet section 162, sixth semiconductor nanosheet section 172, and seventh semiconductor nanosheet section 182.

In various embodiments, the multi-layer nanosheet fin(s) can have a length along the long axis in a range of about 10 nm to about 200 nm, or about 20 nm to about 50 nm, although other lengths are also contemplated.

In one or more embodiments, an endwall support 210 can be formed on opposite ends of the nanosheet fins, where the endwall support(s) 210 can be transverse to the multi-layer nanosheet fin(s). The endwall support(s) 210 can be formed by a blanket deposition that fills in the openings formed by trimming the multi-layer nanosheet fins. The endwall support(s) 210 can be in physical contact with the end walls of the semiconductor nanosheet segments to serve as anchors that hold the individual segments of the multi-layer nanosheet fin(s) and the fin template segment(s) 194 in place during subsequent processing.

In various embodiments, the endwall supports 210 can be made of a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof, where the endwall supports 210 can be selectively etchable relative to the layers of the nanosheet fins and fill layers 200. The endwall supports 210 can be the same material as the fin template segment(s) 194, so the material can be etched together.

Figure 5:
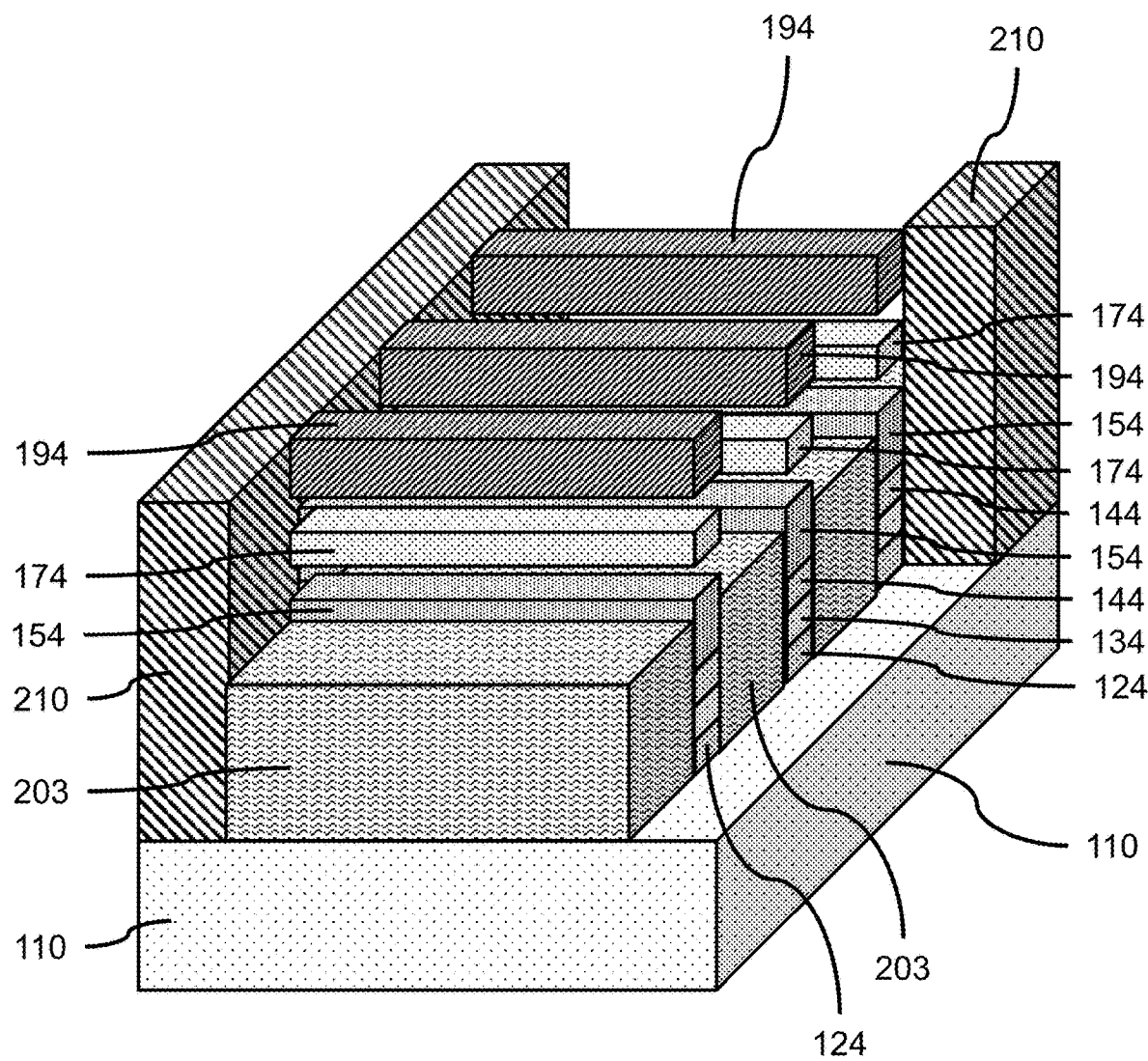
FIG. 5 is a cut-away isometric view showing a reduced height fill layer covering lower segments and exposing upper segments of the nanosheet fins, where select segments of the multi-layer nanosheet fins are removed, in accordance with an embodiment of the present invention.

FIG. 5 is a cut-away isometric view showing a reduced height fill layer covering lower segments and exposing upper segments of the nanosheet fins, where select segments of the multi-layer nanosheet fins are removed, in accordance with an embodiment of the present invention.

In one or more embodiments, the height of the fill layer 200 can be reduced using a directional (e.g., RIE) and/or isotropic etch (e.g., wet chemical etch), where the height of the fill layer 200 can be reduced to below the top surface of the fourth semiconductor nanosheet segment(s) 154 in one or more nanosheet fins. The reduced height fill layer 203 can cover the first, second, and third nanosheet segments, while exposing a portion of the fourth semiconductor nanosheet segment(s) 154 and the fifth, sixth and seventh nanosheet segments.

In one or more embodiments, the exposed fifth semiconductor nanosheet segment(s) 164 and seventh semiconductor nanosheet segment(s) 184 can be removed using a selective, isotropic etch (e.g., wet etch, dry plasma etch) to expose the top and bottom surfaces of the sixth semiconductor nanosheet segment(s) 174. The sixth semiconductor nanosheet segment(s) 174 can be upper semiconductor channel layer(s) for a stacked nanosheet CMOS FET and the fourth semiconductor nanosheet segment(s) 154 can be sacrificial intermediate layers of the nanosheet fins.

Figure 6:
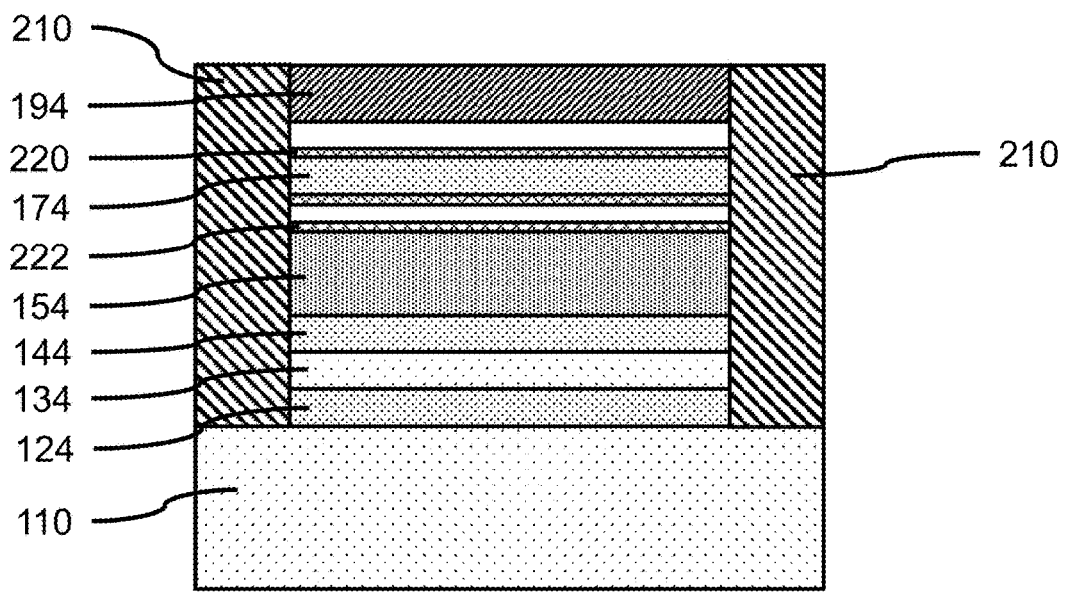
FIG. 6 is a cross-sectional side view along the long axis of the nanosheet fins showing a protective layer on the exposed surfaces of the upper segments of the nanosheet fins, with select upper segments of the multi-layer nanosheet fins removed, in accordance with an embodiment of the present invention.

FIG. 6 is a cross-sectional side view along the long axis of the nanosheet fins showing a protective layer on the exposed surfaces of the upper segments of the nanosheet fins, with select upper segments of the multi-layer nanosheet fins removed, in accordance with an embodiment of the present invention.

In one or more embodiments, a protective layer 220 can be formed on the exposed surfaces of the sixth semiconductor nanosheet segment(s) 174, where the protective layer 220 can be formed by a conformal deposition, for example, atomic layer deposition (ALD), plasma enhanced ALD (PEALD), or a combination thereof. The conformal deposition can also form a protective cap 222 on the exposed surfaces of the fourth semiconductor nanosheet segment(s) 154.

In one or more embodiments, the protective layer 220 and protective cap 222 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In various embodiments, the protective layer 220 and protective cap 222 can have a thickness in a range of about 2 nm to about 5 nm, or about 3 nm to about 4 nm.

Figure 7:
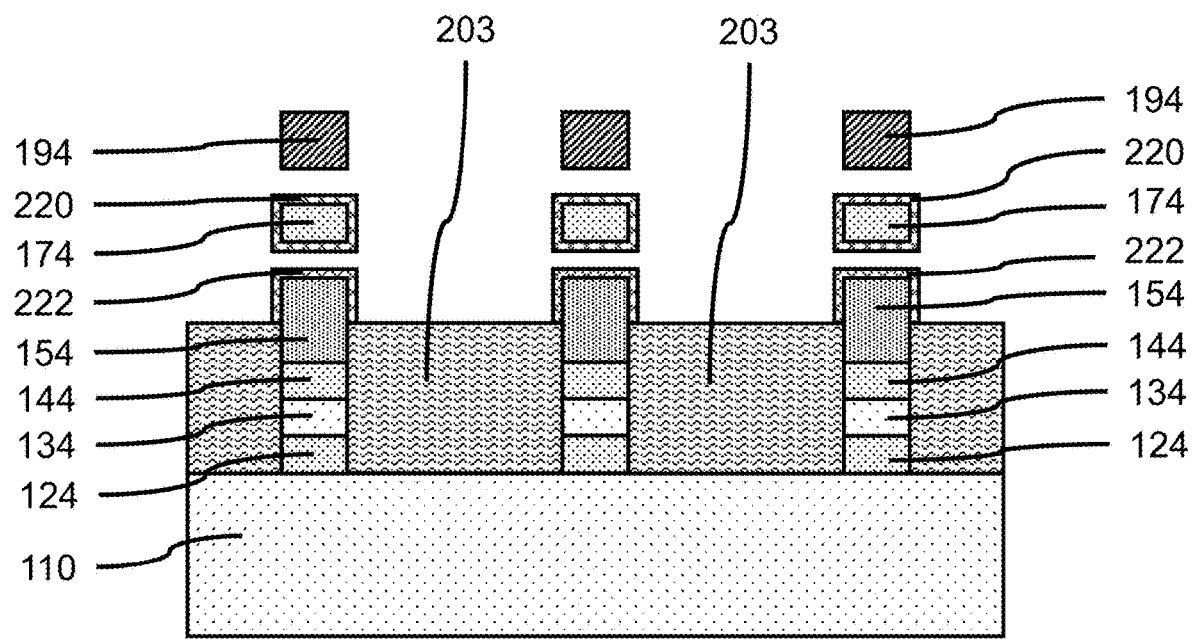
FIG. 7 is a cross-sectional side view along the short axis of the nanosheet fins showing a protective layer around each of the upper semiconductor channel layers of the nanosheet fins, and protective caps on the exposed surface of the sacrificial intermediate layers of the nanosheet fins, in accordance with an embodiment of the present invention.

FIG. 7 is a cross-sectional side view along the short axis of the nanosheet fins showing a protective layer around each of the upper semiconductor channel layers of the nanosheet fins, and protective caps on the exposed surface of the sacrificial intermediate layers of the nanosheet fins, in accordance with an embodiment of the present invention.

In one or more embodiments, the conformal deposition can be selective for the semiconductor material surfaces, so the protective layer does not form on the fin template segment(s) 194 or the surface of the reduced height fill layer 203, or the conformal deposition can be non-selective, and portions of the protective layer material can be removed from the fill layer using a directional etch (e.g., RIE).

Figure 8:
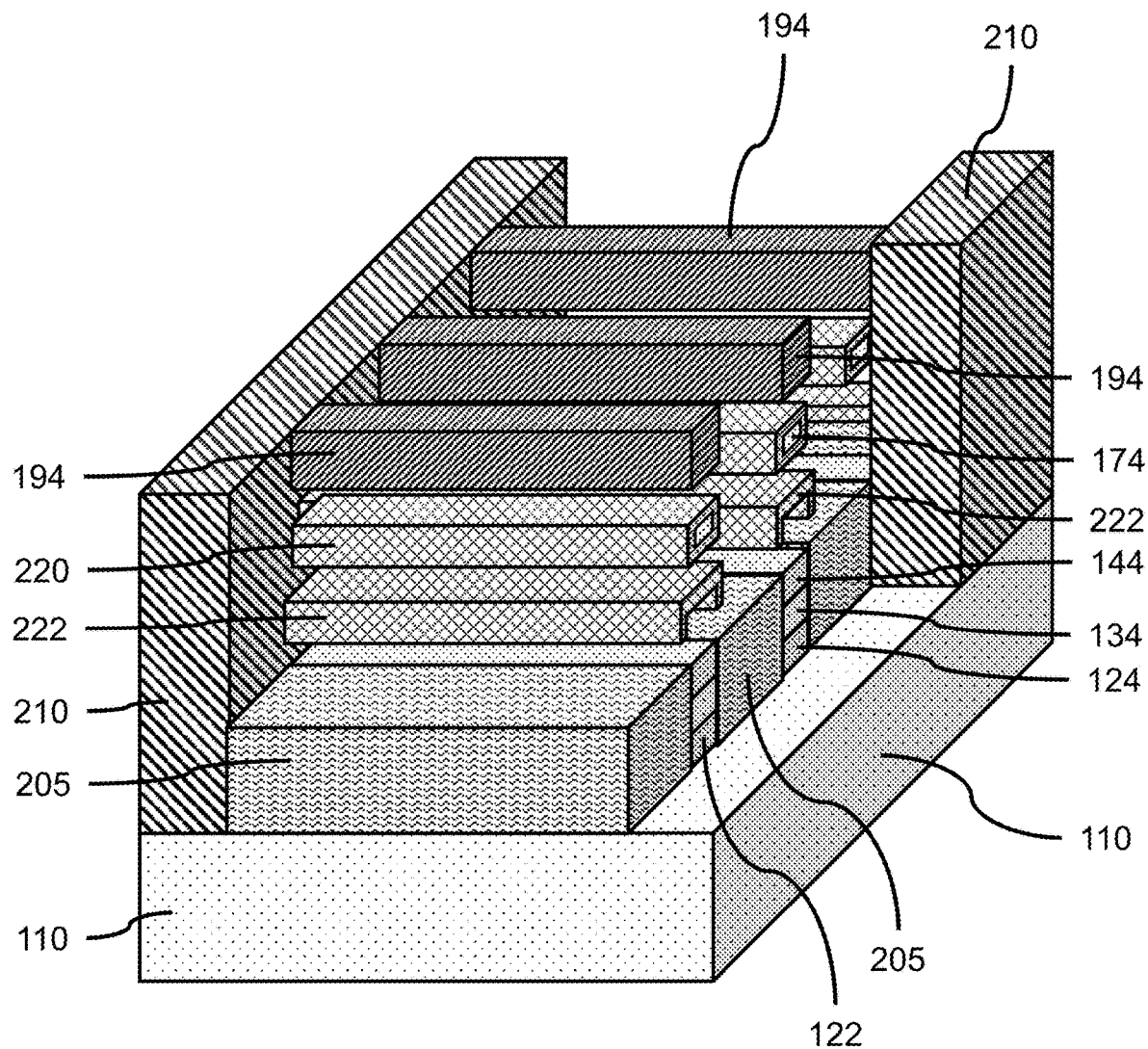
FIG. 8 is a cut-away isometric view showing a further reduced height fill layer, and the sacrificial intermediate layers removed from below the protective caps, in accordance with an embodiment of the present invention.

FIG. 8 is a cut-away isometric view showing a further reduced height fill layer, and the sacrificial intermediate layers removed from below the protective caps, in accordance with an embodiment of the present invention.

In one or more embodiments, the height of the reduced height fill layer 203 can be further reduced to form a further reduced height fill layer 205 and expose the sidewalls of the fourth semiconductor nanosheet segment(s) 154. The fourth semiconductor nanosheet segment(s) 154 can be removed, so the top surface of the third semiconductor nanosheet segment(s) 144 is exposed. The first semiconductor nanosheet segment(s) 124 and second semiconductor nanosheet segment(s) 134 can remain covered by the further reduced height fill layer 205.

Figure 9:
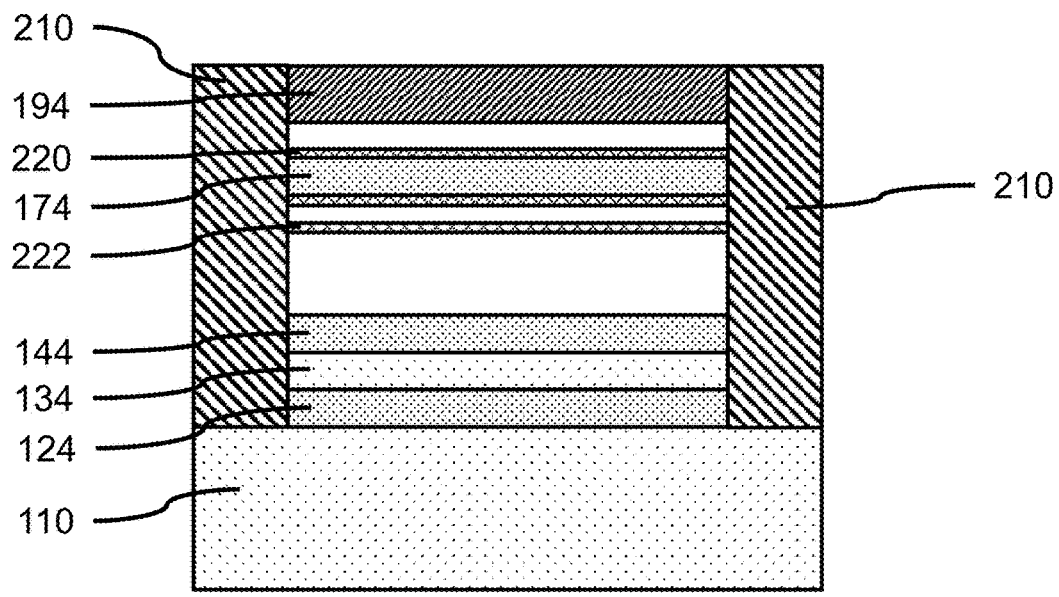
FIG. 9 is a cross-sectional side view along the long axis of the nanosheet fins showing the sacrificial intermediate layer removed from below the protective cap, in accordance with an embodiment of the present invention.

FIG. 9 is a cross-sectional side view along the long axis of the nanosheet fins showing the sacrificial intermediate layer removed from below the protective cap, in accordance with an embodiment of the present invention.

In one or more embodiments, the fourth semiconductor nanosheet segment(s) 154 can be removed from below the protective cap(s) 222 using an isotropic etch (e.g., wet chemical etch). The protective cap(s) 222 can remain suspended from between the endwall supports 210.

Figure 10:
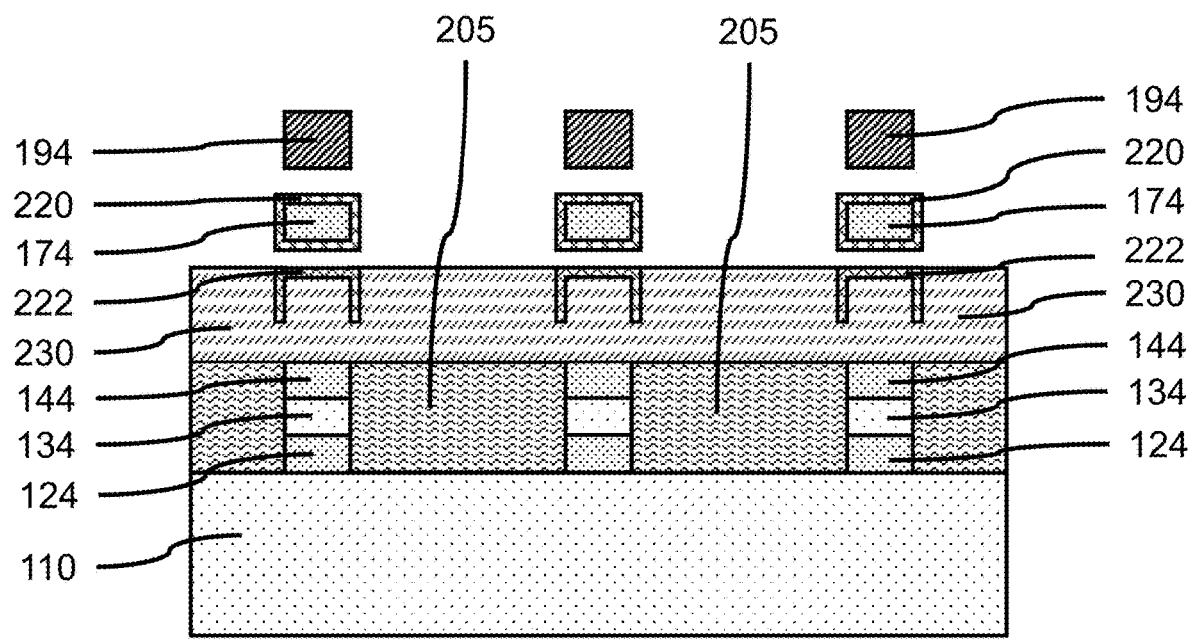
FIG. 10 is a cross-sectional side view along the short axis of the nanosheet fins showing a dummy layer on the further reduced height fill layer and below the protective caps, in accordance with an embodiment of the present invention.

FIG. 10 is a cross-sectional side view along the short axis of the nanosheet fins showing a dummy layer on the further reduced height fill layer and below the protective caps, in accordance with an embodiment of the present invention.

In one or more embodiments, a dummy layer 230 can be formed on the further reduced height fill layer 205 and below the protective caps 222. The dummy layer 230 can be formed by a conformal deposition (e.g., ALD, PEALD) that can fill in the space under the protective caps 222. Excess material of the dummy layer 230 can be removed using a directional etch (e.g., RIE) and/or isotropic etch to expose the protective layer(s) 220 and protective cap(s) 222, where a top surface of the protective cap(s) 222 can be exposed.

In various embodiments, the dummy layer 230 can be a dielectric material, including, but not limited to carbon doped silicon oxide (SiO:C), or silicon oxycarbide (SiOC).

Figure 11:
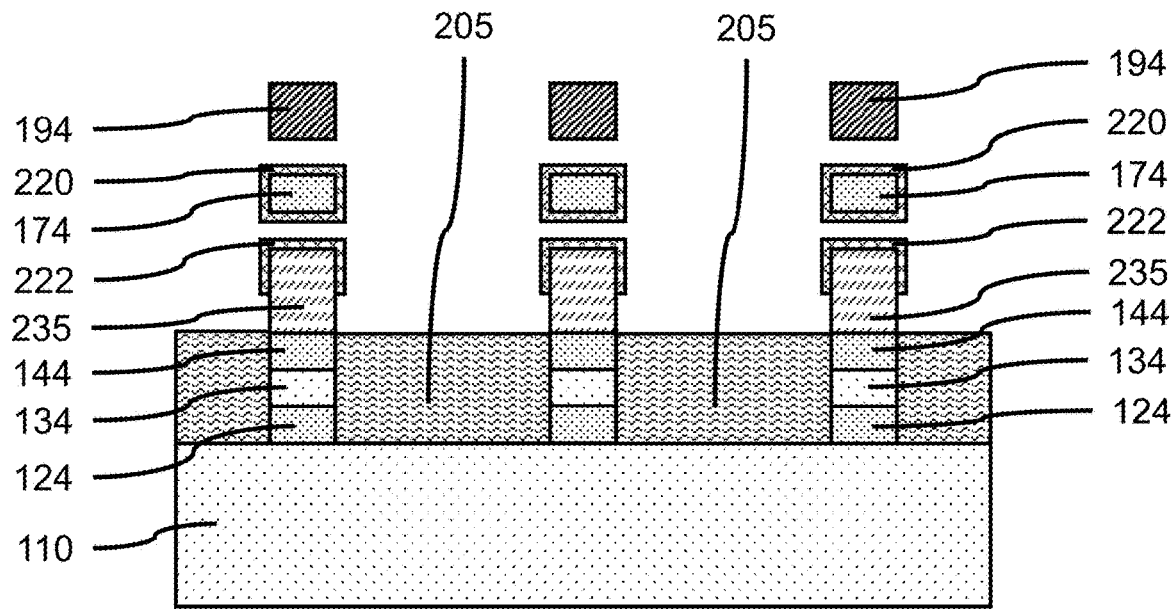
FIG. 11 is a cross-sectional side view along the short axis of the nanosheet fins showing a portion of the dummy layer removed from between the nanosheet fins, and forming a partition block below the protective caps, in accordance with an embodiment of the present invention.

FIG. 11 is a cross-sectional side view along the short axis of the nanosheet fins showing a portion of the dummy layer removed from between the nanosheet fins, and forming a partition block below the protective caps, in accordance with an embodiment of the present invention.

In one or more embodiments, a directional etch can be used to remove portions of the dummy layer 230 between the multi-layer nanosheet fins, to form a partition block 235 below each of the protective cap(s) 222. In various embodiments, an isotropic etch can be used to reduce the width of the partition block(s) 235 to be less than the width of the protective cap(s) 222 and approximately the same width as the sixth semiconductor nanosheet segment(s) 174 and the third semiconductor nanosheet segment(s) 144 and second semiconductor nanosheet segment(s) 134.

Figure 12:
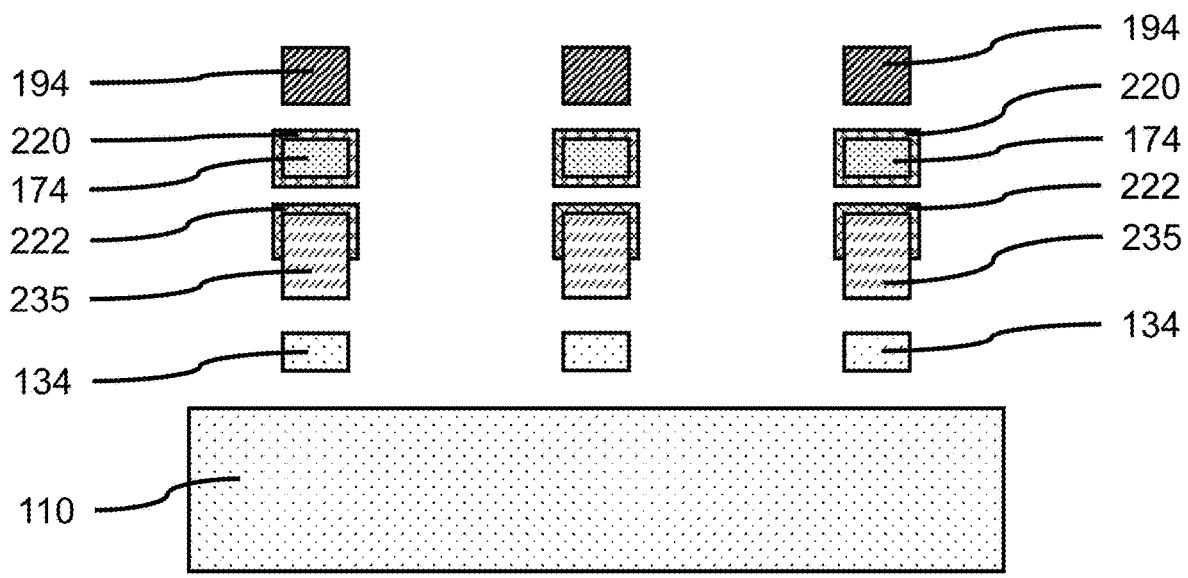
FIG. 12 is a cross-sectional side view along the short axis of the nanosheet fins showing the further reduced height fill layer removed, and select lower layers of the multi-layer nanosheet fins removed, in accordance with an embodiment of the present invention.

FIG. 12 is a cross-sectional side view along the short axis of the nanosheet fins showing the further reduced height fill layer removed, and select lower layers of the multi-layer nanosheet fins removed, in accordance with an embodiment of the present invention.

In one or more embodiments, the further reduced height fill layer 205 can be removed using an isotropic etch to expose the third semiconductor nanosheet segment(s) 144, second semiconductor nanosheet segment(s) 134, first semiconductor nanosheet segment(s) 124, and the substrate surface.

In one or more embodiments, the exposed third semiconductor nanosheet segment(s) 144 and first semiconductor nanosheet segment(s) 124 can be selectively removed to expose the top and bottom surfaces of the second semiconductor nanosheet segment(s) 134 using an isotropic etch. The second semiconductor nanosheet segment(s) 134 can be lower semiconductor channel layer(s) for a stacked nanosheet CMOS FET.

Figure 13:
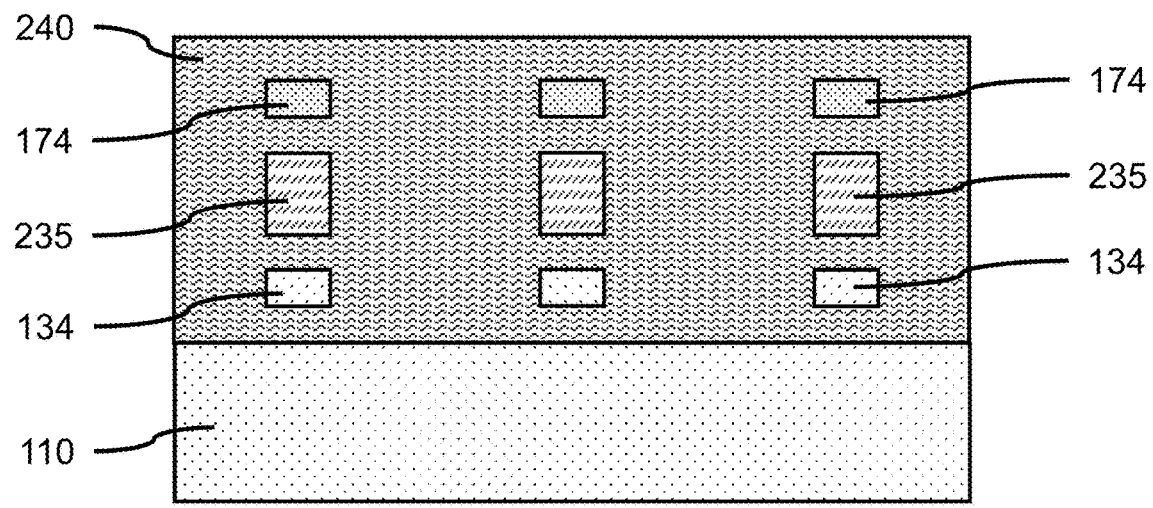
FIG. 13 is a cross-sectional side view along the short axis of the nanosheet fins showing the protective layers removed from around the upper semiconductor channel layers, and a separation slab on the upper semiconductor channel layers and lower semiconductor channel layers, in accordance with an embodiment of the present invention.

FIG. 13 is a cross-sectional side view along the short axis of the nanosheet fins showing the protective layers removed from around the upper semiconductor channel layers, and a separation layer formed on the upper semiconductor channel layers and lower semiconductor channel layers, in accordance with an embodiment of the present invention.

In one or more embodiments, the protective layers 220 can be removed from around the sixth semiconductor nanosheet segment(s) 174, so the upper semiconductor channel layers can be exposed, and the protective caps 222 can be removed from the partition blocks 235.

In one or more embodiments, a separation layer 240 can be formed on the sixth semiconductor nanosheet segment(s) 174 and second semiconductor nanosheet segment(s) 134, where the separation layer 240 can be formed by a conformal deposition and/or blanket deposition to fill in the spaces between the partition block(s) 235 and sixth semiconductor nanosheet segment(s) 174 and second semiconductor nanosheet segment(s) 134. The separation layer 240 can be a dielectric material, for example, silicon oxide (SiO), a low-k dielectric, or a combination thereof.

Figure 14:
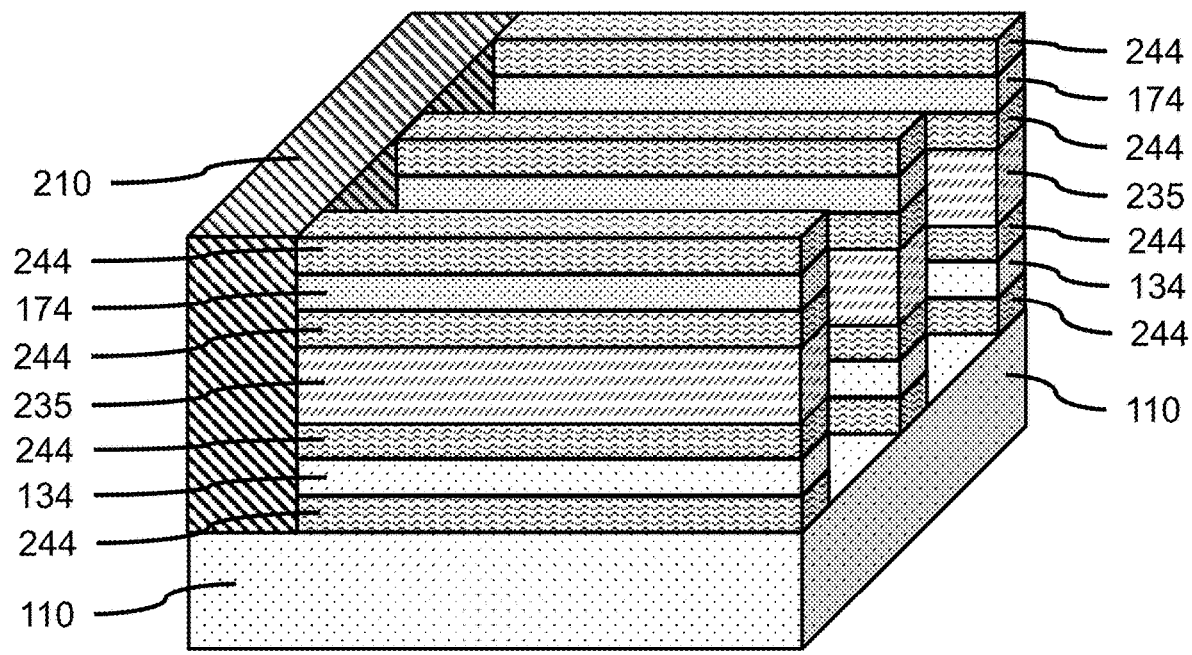
FIG. 14 is a cut-away isometric view showing separation slabs on the upper and lower semiconductor channel layers, in accordance with an embodiment of the present invention.

FIG. 14 is a cut-away isometric view showing separation slabs on the upper and lower semiconductor channel layers, in accordance with an embodiment of the present invention.

In one or more embodiments, portions of the separation layer 240 can be masked and removed from between the sixth semiconductor nanosheet segment(s) 174, where the underlying portions of the separation layer 240 can remain between the partition block(s) 235 and sixth semiconductor nanosheet segment(s) 174 and second semiconductor nanosheet segment(s) 134 to form separation slabs 244. Portions of the substrate 110 can be exposed between the bottom most separation slabs 244. The endwall supports 210 can be formed on opposite ends of the sixth semiconductor nanosheet segment(s) 174, second semiconductor nanosheet segment(s) 134, and separation slabs 244. The separation layer 240 can be a dielectric material, including, silicon oxide (SiO), a low-k dielectric material, or a combination thereof.

Figure 15:
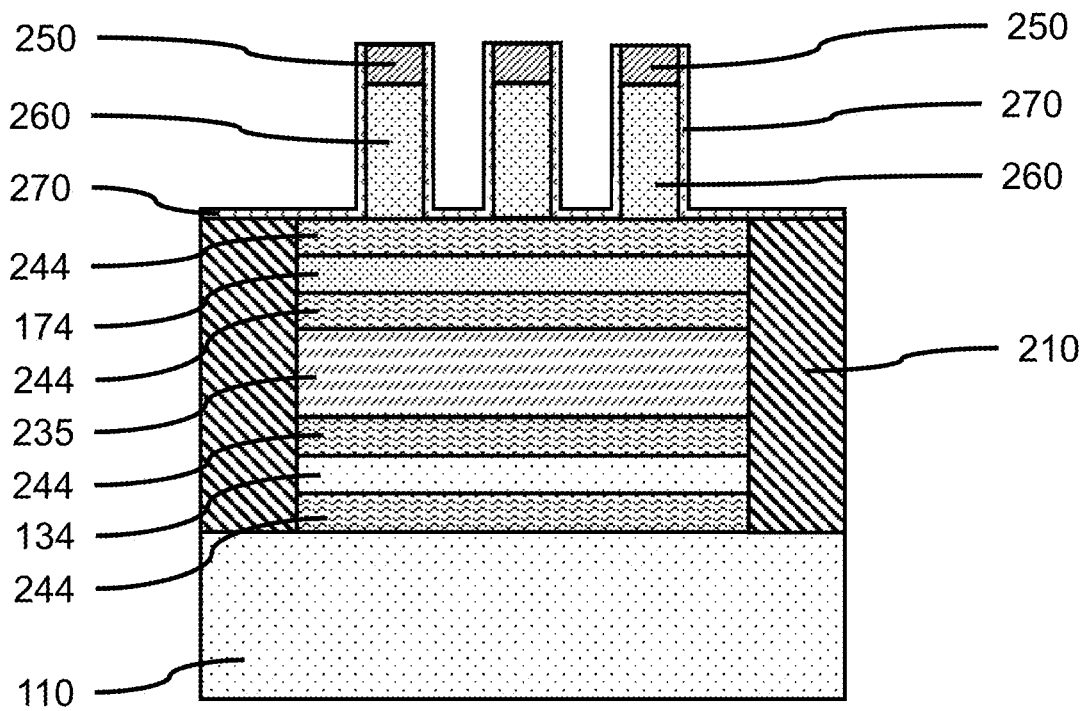
FIG. 15 is a cross-sectional side view along the long axis of the nanosheet fins showing a plurality of dummy gate structures formed on the top separation slab, in accordance with an embodiment of the present invention.

FIG. 15 is a cross-sectional side view along the long axis of the nanosheet fins showing a plurality of dummy gate structures formed on the top separation slab, in accordance with an embodiment of the present invention.

In one or more embodiments, a plurality of dummy gate structures can be formed on the top separation slab 244, where a dummy gate fill layer can be formed between the nanosheet fins and on the top most separation slabs 244 by a blanket deposition. A gate cap layer can be formed on the dummy gate fill layer, and the gate cap layer can be masked and etched to form dummy gate caps 250 and dummy gate posts 260 on the top most separation slabs 244. A conformal deposition can be used to form a dummy gate liner 270 on the exposed surfaces of the dummy gate caps 250 and dummy gate posts 260 to form the dummy gate structures. The dummy gate posts 260 can be a sacrificial material, for example, amorphous silicon (a-Si) or amorphous carbon, (a-C). The dummy gate caps 250 and dummy gate liner 270 can be a hardmask material, for example, silicon nitride.

Figure 16:
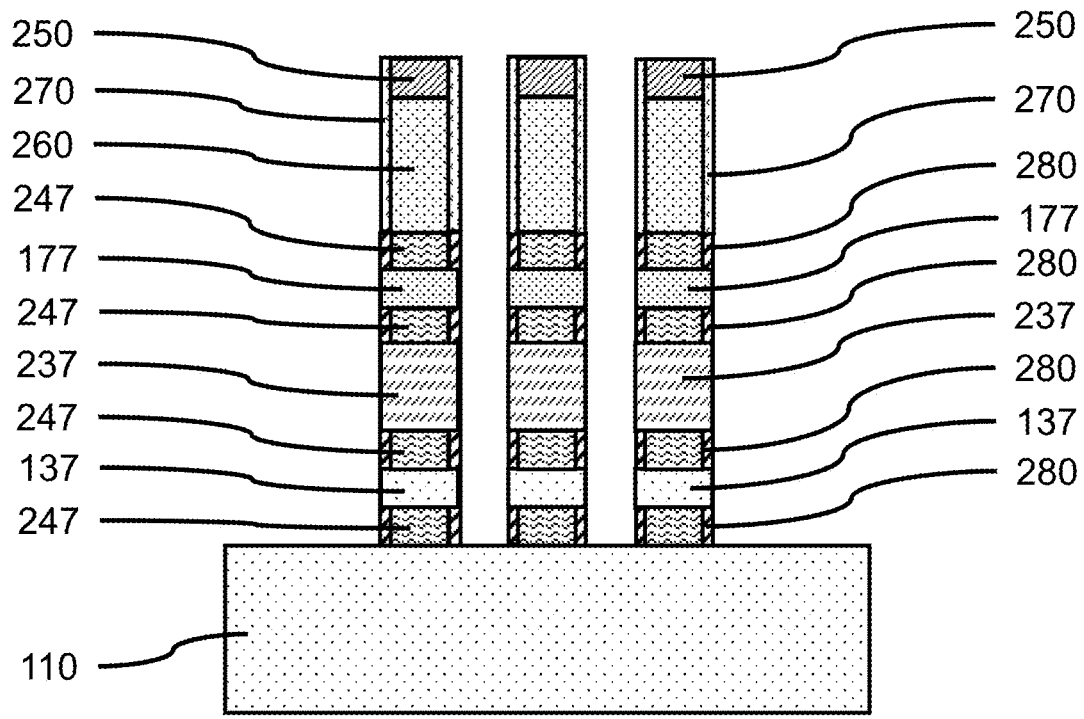
FIG. 16 is a cross-sectional side view along the long axis of the nanosheet fins showing the upper semiconductor channel layers and lower semiconductor channel layers divided into upper semiconductor channel sheets and lower semiconductor channel sheets, in accordance with an embodiment of the present invention.

FIG. 16 is a cross-sectional side view along the long axis of the nanosheet fins showing the upper semiconductor channel layers and lower semiconductor channel layers divided into upper semiconductor channel sheets and lower semiconductor channel sheets, in accordance with an embodiment of the present invention.

In one or more embodiments, the sixth semiconductor nanosheet segment(s) 174 and second semiconductor nanosheet segment(s) 134 can be divided into upper semiconductor channel sheets 177 and lower semiconductor channel sheets 137, and the separation slabs 244 can be divided into separation sheets 247 on opposite sides of the channel sheets. The partition block 235 can be divided into partition sheets 237. The dummy gate structure(s) can be used as masks, and a directional etch (e.g., RIE) can be used to remove portions of the sixth semiconductor nanosheet segment(s) 174, second semiconductor nanosheet segment (s) 134, partition block 235, and separation slabs 244.

In one or more embodiments, portions of the separation sheets 247 can be removed using an isotropic etch to form recesses. A conformal deposition can be used to fill in the recesses, and an isotropic etch can be used to remove material from the sidewalls to form inner spacers 280. The inner spacers can be a dielectric material, for example, silicon boro carbonitride (SiBCN).

Figure 17:
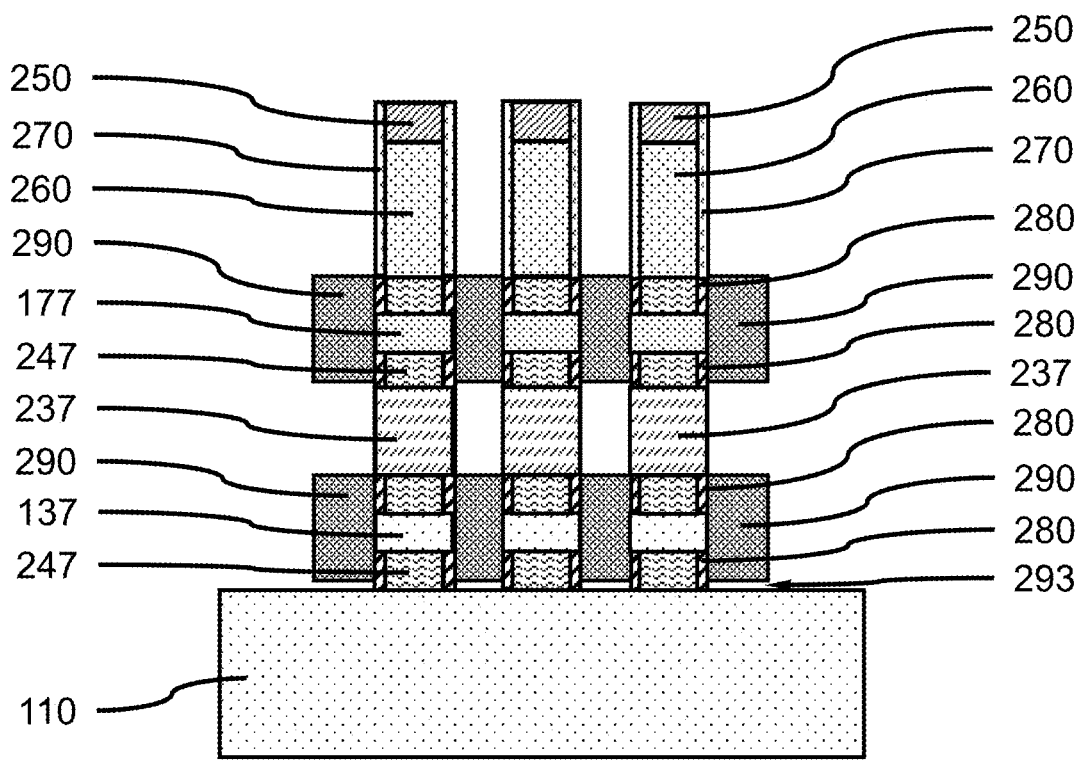
FIG. 17 is a cross-sectional side view along the long axis of the nanosheet fins showing source/drain layers formed selectively on the upper semiconductor channel sheets and lower semiconductor channel sheets, in accordance with an embodiment of the present invention.

FIG. 17 is a cross-sectional side view along the long axis of the nanosheet fins showing source/drain layers formed selectively on the upper semiconductor channel sheets and lower semiconductor channel sheets, in accordance with an embodiment of the present invention.

In one or more embodiments, source/drain layers 290 can be formed on the exposed surfaces of the upper semiconductor channel sheets 177 and lower semiconductor channel sheets 137. The source/drain layers 290 can be formed by an epitaxial or heteroepitaxial growth process, where the source/drain layers 290 can span the distances between adjacent upper semiconductor channel sheets 177, and the distance between adjacent lower semiconductor channel sheets 137 to form merged source/drains. A gap 293 can be between the top surface of the substrate and the bottom surface of the source/drain layer 290 formed on the lower semiconductor channel sheets 137.

Figure 18:
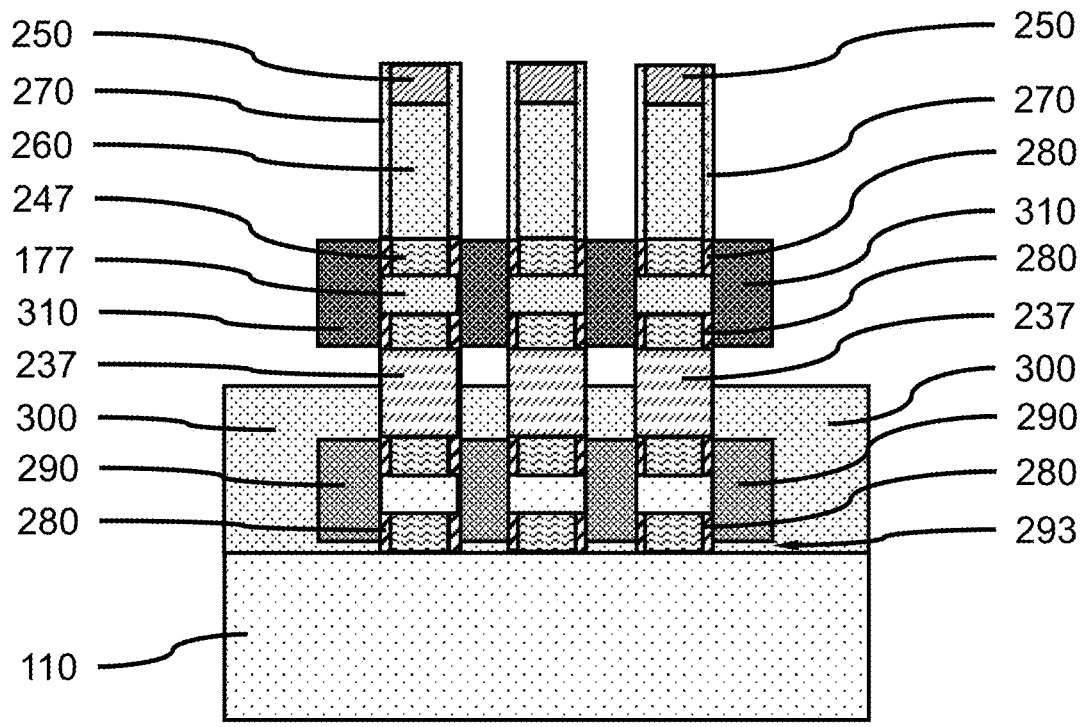
FIG. 18 is a cross-sectional side view along the long axis of the nanosheet fins showing the source/drain layer on the upper semiconductor channel sheets removed, and a substitution source/drain layer formed on the upper semiconductor channel sheets, in accordance with an embodiment of the present invention.

FIG. 18 is a cross-sectional side view along the long axis of the nanosheet fins showing the source/drain layer on the upper semiconductor channel sheets removed, and a substitution source/drain layer formed on the upper semiconductor channel sheets, in accordance with an embodiment of the present invention.

In one or more embodiments, the lower source/drain layer(s) 290 can be covered with a cover layer 300, where the cover layer 300 can be formed by a conformal deposition and etch back to expose the upper source/drain 290. The cover layer 300 can be a dielectric material that can be selectively removed without removing the partition sheets 237.

In one or more embodiments, the upper source/drain 290 can be removed using a selective, isotropic etch. A substitution source/drain layer 310 formed on the upper semiconductor channel sheets 177, where the substitution source/drain layer 310 formed by an epitaxial or heteroepitaxial growth process.

In one or more embodiments, the substitution source/drain layer 310 can be doped to be an n-type semiconductor source/drain layer or a p-type semiconductor source/drain layer. In various embodiments, n-type dopants can be, for example, phosphorus (P) or arsenic (As), and p-type dopants can be, for example, boron (B) or gallium (Ga). In various embodiments, the substitution source/drain layer 310 can be a semiconductor material, including, but not limited to n-type (e.g., P or As) doped silicon (Si) or p-type (e.g., B) doped silicon-germanium (SiGe). The substitution source/drain layer 310 can be a different material and have a different dopant type than the lower source/drain 290.

Figure 19:
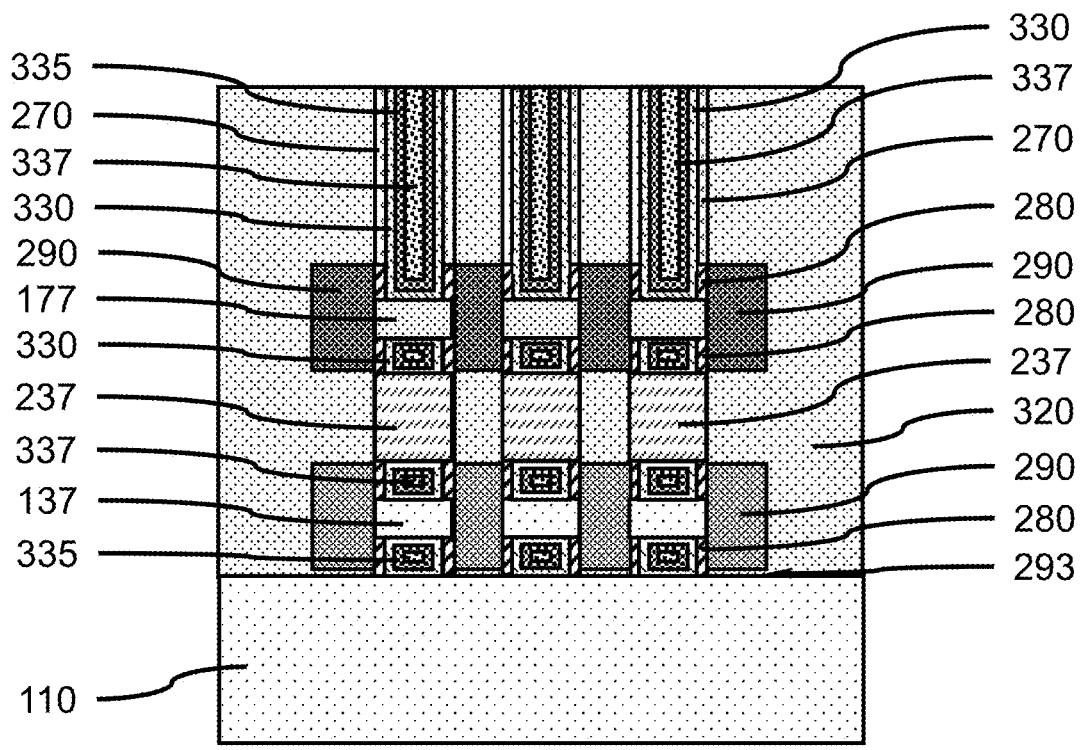
FIG. 19 is a cross-sectional side view along the long axis of the nanosheet fins showing the dummy gate structures removed, and active gate structures formed on the upper and lower semiconductor channel sheets, in accordance with an embodiment of the present invention.

FIG. 19 is a cross-sectional side view along the long axis of the nanosheet fins showing the dummy gate structures removed, and active gate structures formed on the upper and lower semiconductor channel sheets, in accordance with an embodiment of the present invention.

In one or more embodiments, the cover layer 300 can be removed and an interlayer dielectric (ILD) layer 320 can be formed on the dummy gate structure and fin structures, where the ILD layer can be a dielectric material (e.g., SiO).

In one or more embodiments, the dummy gate caps 250 and dummy gate posts 260 can be removed to expose a top surface of the upper semiconductor channel sheets 177, lower semiconductor channel sheets 137, and separation sheets 247 using a selective etch. The separation sheets 247 can be removed from opposite sides of the channel sheets. Active gate structures can be formed on the upper semiconductor channel sheets 177 and lower semiconductor channel sheets 137. The active gate structures can include a gate dielectric layer 330 formed on the exposed surfaces of the upper semiconductor channel sheets 177 and lower semiconductor channel sheets 137, and a conductive gate fill formed on the gate dielectric layer. The gate dielectric layer 330 can be silicon oxide (SiO), silicon nitride (SiN), a high-K dielectric material, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 330 can have a thickness in a range of about 1 nm to about 3 nm, or about 2 nm, although other thicknesses are also contemplated. The gate dielectric layer can be formed by a conformal deposition (e.g., ALD, PEALD).

The active gate structures can have multiple layers, including a work function layer 335 on the gate dielectric layer and a conductive gate fill 337 on the work function layer 335, where the work function layer 335 can be formed by a conformal deposition and the conductive gate fill 337 can be formed by a conformal or blanket deposition.

In various embodiments, the work function layer 335 can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof. In various embodiments, the conductive gate fill can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, or any suitable combination of these materials.

In various embodiments, the work function layer 335 can be different thicknesses on the upper semiconductor channel sheets 177 and lower semiconductor channel sheets 137, and/or the work function layer can be different materials on the upper semiconductor channel sheets 177 and lower semiconductor channel sheets 137 by pinching off an opening formed by removing the separation sheets 247 using a sacrificial fill, and forming the work function layer in two steps.

The gate dielectric layer, work function layer, and conductive gate fill can wrap around the upper semiconductor channel sheets 177 and lower semiconductor channel sheets 137.

Figure 20:
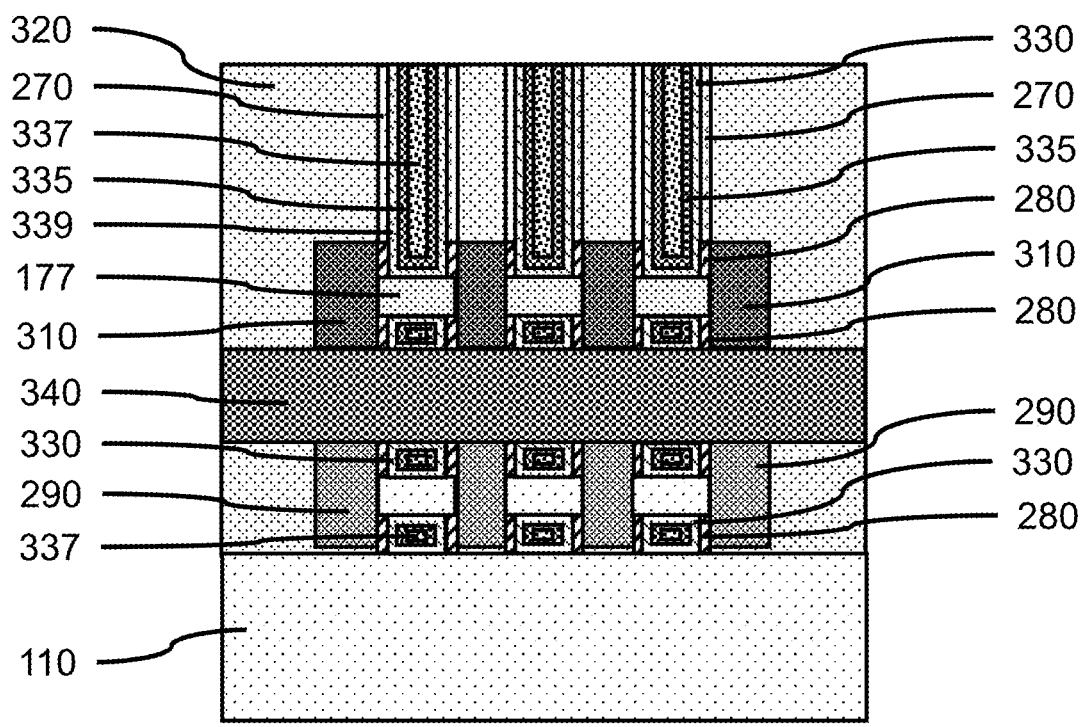
FIG. 20 is a cross-sectional side view along the long axis of the nanosheet fins showing an isolation layer formed between the upper and lower semiconductor channel sheets, in accordance with another embodiment of the present invention.

FIG. 20 is a cross-sectional side view along the long axis of the nanosheet fins showing an isolation layer formed between the upper and lower semiconductor channel sheets, in accordance with another embodiment of the present invention.

In one or more embodiments, the partition sheets 237 can be removed after forming the source/drain layers 290, where the partition sheets 237 can be removed using a selective isotropic etch. The spaces between the source/drain layers 290 can then be filled with another dielectric material to form a substitute partition sheets 340 that electrically isolates a top CMOS FET from a bottom CMOS FET, and control the parasitic capacitances between the top and bottom CMOS FETs by adjusting the dielectric constant of the substitute partition sheets 340. In various embodiments, additional partition sheets 237 can be formed on the source/drain layers 290, leverage the growth to the bottom surface of active gate structures and then form the substitution source/drain layer 310.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display and a central processor.

It should also be understood that material compounds will be described in terms of listed elements, e.g., SiGe. These compounds include different proportions of the elements within the compound, e.g., SiGe includes Si$_x$Ge1-x where x is less than or equal to 1, etc. In addition, other elements can be included in the compound and still function.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. It will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabrication a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a stacked nanosheet complementary metal-oxide-semiconductor (CMOS) field effect transistor (FET) device, comprising:
    forming a plurality of semiconductor layers on a substrate;
    patterning the plurality of semiconductor layers to form a plurality of multi-layer nanosheet fins, wherein each multi-layer nanosheet fin includes a plurality of semiconductor nanosheet segments;
    forming a fill layer between the multi-layer nanosheet fins;
    depositing an endwall support on opposite ends of each of the nanosheet fins;
    reducing a height of the fill layer to expose at least a portion of a top group of semiconductor nanosheet segments of the multi-layer nanosheet fins, while covering at least a portion of a bottom group of semiconductor nanosheet segments;
    removing at least one of the top group of semiconductor nanosheet segments; and
    forming a protective layer on one or more remaining semiconductor nanosheet segments.

2. The method of claim 1, wherein the plurality of semiconductor layers includes seven semiconductor layers that forms seven semiconductor nanosheet segments including fifth and seventh semiconductor nanosheet segments of each of the plurality of multi-layer nanosheet fins, and the fifth and seventh semiconductor nanosheet segments are subsequently removed.

3. The method of claim 2, further comprising further reducing the height of the reduced height fill layer to expose a fourth semiconductor nanosheet segment on the bottom group of semiconductor nanosheet segments of each of the plurality of multi-layer nanosheet fins, and removing the fourth semiconductor nanosheet segments.

4. The method of claim 3, further comprising forming a partition block below a sixth semiconductor nanosheet segment covered by the protective layer in each of the plurality of multi-layer nanosheet fins.

5. The method of claim 4, further comprising removing the further reduced height fill layer to expose first, second, and third semiconductor nanosheet segments of the bottom group of each of the plurality of multi-layer nanosheet fins, and removing the first and third semiconductor nanosheet segments.

6. The method of claim 5, wherein the second semiconductor nanosheet segments are silicon and the sixth semiconductor nanosheet segments are silicon-germanium.

7. The method of claim 6, further comprising forming separation slabs between the partition blocks and the second semiconductor nanosheet segments, and forming separation slabs between the partition blocks and the sixth semiconductor nanosheet segments.

8. The method of claim 7, further comprising forming a plurality of dummy gate structures on the separation slabs, the sixth semiconductor nanosheet segments, and the second semiconductor nanosheet segments.

9. The method of claim 8, further comprising dividing the separation slabs, the sixth semiconductor nanosheet segments, and the second semiconductor nanosheet segments into separation sheets, upper semiconductor channel sheets, and lower semiconductor channel sheets.

10. The method of claim 9, further comprising forming a first source/drain layer on the upper semiconductor channel sheets and forming a second source/drain layer on the lower semiconductor channel sheets.

11. A method of forming a stacked nanosheet complementary metal-oxide-semiconductor (CMOS) field effect transistor (FET) device, comprising:
    forming seven semiconductor layers on a substrate;
    patterning the seven semiconductor layers to form a multi-layer nanosheet fin, including a stack of seven semiconductor nanosheet segments;
    forming an endwall support on opposite ends of the nanosheet fin;
    removing a fifth and a seventh semiconductor nanosheet segment from the multi-layer nanosheet fin;
    forming a protective layer on a sixth semiconductor nanosheet segment and a protective cap on an upper portion of a fourth semiconductor nanosheet segment; and
    removing the fourth semiconductor nanosheet segment from below the protective cap.

12. The method of claim 11, wherein the fifth and the seventh semiconductor nanosheet segments are silicon and the fourth and the sixth semiconductor nanosheet segments are silicon-germanium.

13. The method of claim 12, wherein the fourth semiconductor nanosheet segment has a greater germanium concentration than the sixth semiconductor nanosheet segment.

14. The method of claim 13, further comprising removing first and second semiconductor nanosheet segments.

15. The method of claim 14, further comprising dividing the sixth semiconductor nanosheet segment into a plurality of upper semiconductor channel sheets and the second semiconductor nanosheet segment into a plurality of lower semiconductor channel sheets.

16. The method of claim 15, further comprising forming an active gate structure on the plurality of upper semiconductor channel sheets and plurality of lower semiconductor channel sheets.

* * * * *